United States Patent

Saeki

[11] Patent Number: 6,005,421
[45] Date of Patent: Dec. 21, 1999

[54] SYNCHRONOUS DELAY CIRCUIT FOR GENERATING SYNCHRONOUS DELAYED SIGNALS WITH SHORT TIME AND FREQUENCY MULTIPLYING CIRCUIT USING THE SAME

[75] Inventor: Takanori Saeki, Tokyo, Japan

[73] Assignee: NEC Corporation, Tokyo, Japan

[21] Appl. No.: 09/055,955

[22] Filed: Apr. 7, 1998

[30] Foreign Application Priority Data

Apr. 25, 1997 [JP] Japan ................................. 9-123040

[51] Int. Cl.[6] .................................................. H03B 19/00
[52] U.S. Cl. ........................ 327/119; 327/116; 327/121; 327/161
[58] Field of Search .......................... 327/116, 120–129, 327/150–159, 161, 245; 377/47

[56] References Cited

U.S. PATENT DOCUMENTS

| 5,530,387 | 6/1996 | Kim ......................................... 327/119 |
| 5,684,418 | 11/1997 | Yanaguichi ............................... 327/99 |
| 5,789,953 | 8/1998 | Au ............................................ 327/116 |

OTHER PUBLICATIONS

Shimizu et al., "A Multimedia 32b RISC Microprocessor With 16Mb DRAM", *IEEE International Solid–State Circuit Conference*, pp. 216–217, (1996).

*Primary Examiner*—Timothy P. Callahan
*Assistant Examiner*—An T Luu
*Attorney, Agent, or Firm*—Foley & Lardner

[57] ABSTRACT

In a frequency multiplier circuit, a first delaying section delays a reference signal and generates an output signal when the reference signal has been delayed by a predetermined delay time. A second delaying section generates n (n is an integer more than 0) delayed signals from the reference signal. The first delayed signal of the n delayed signals has a first delay time with respect to the reference signal, and an m-th delayed signal (m is a positive integer and $m \leq n$) of the n delayed signal has an m-th delay time with respect to the reference signal. The first through n-th delay times are integer multiples of the first delay time and the predetermined delay time is equal to (n+1) times the first delay time. The second delaying section has a plurality of different input locations for receiving the reference signal and one of the input locations is set to receive the reference signal in accordance with a setting signal from the first delaying section.

36 Claims, 4 Drawing Sheets

Fig. 1 PRIOR ART

Fig. 4

SYNCHRONOUS DELAY CIRCUIT FOR GENERATING SYNCHRONOUS DELAYED SIGNALS WITH SHORT TIME AND FREQUENCY MULTIPLYING CIRCUIT USING THE SAME

BACKGROUND OF THE PRESENT INVENTION

1. Field of the Present Invention

The present invention relates to a semiconductor integrated circuit and more particularly to a synchronous delay circuit for generating a synchronously delayed signal with a short time and a frequency multiplying circuit using the same in a semiconductor device.

2. Description of the Related Art

Figure 1:
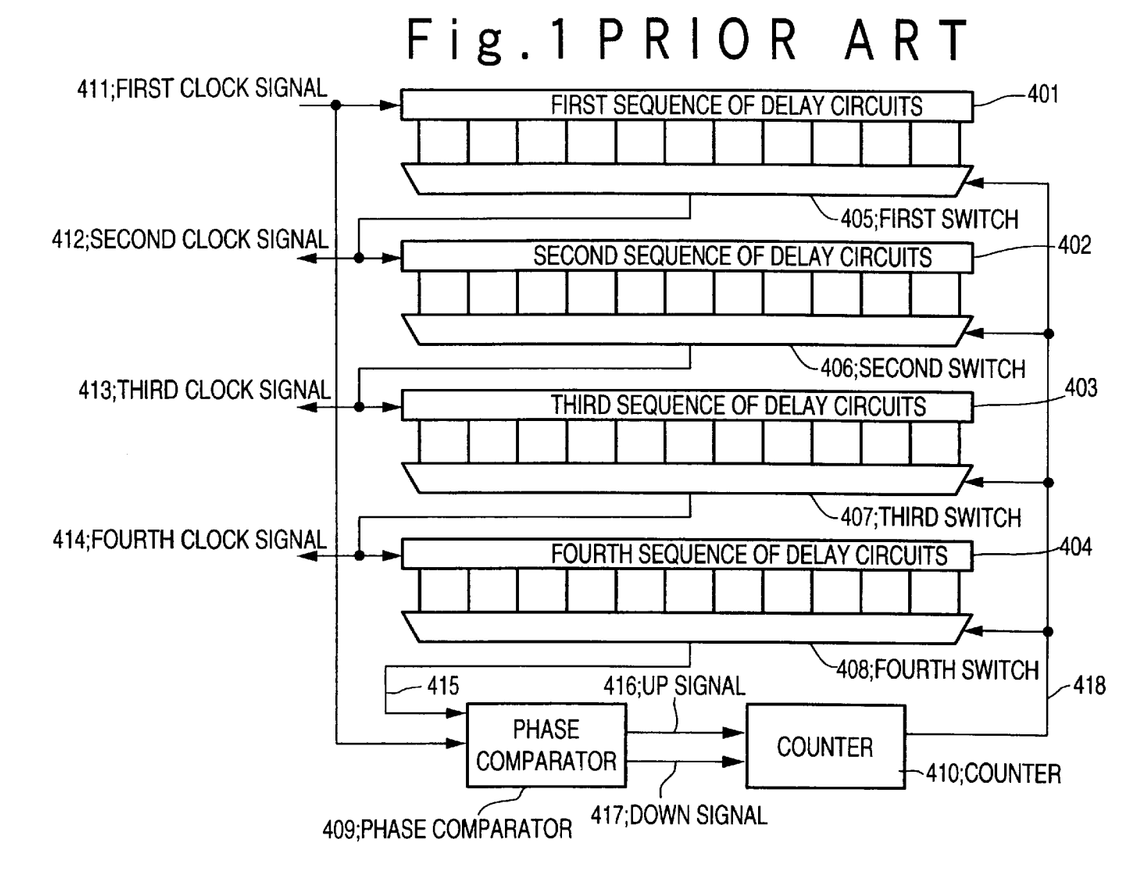
FIG. 1 is a block diagram illustrating the structure of a conventional example of a synchronous delay circuit.

As a conventional example of a synchronous delay circuit using a sequence of delay circuits, a circuit is proposed in, for example, "A Multimedia 32b RISC Microprocessor with 16 Mb DRAM" by T. Shimizu, (IEEE International Solid-State Circuit Conference 1996, ISSCC Digest of Technical Papers, Feb., 1996, pp. 216 to 217). FIG. 1 shows the synchronous delay circuit in the case where the frequency of a clock signal is multiplied by 4 times.

Referring to FIG. 1, four sequences of delay circuits, i.e., first to fourth sequences of delay circuits 401 to 404 are connected in serial. The output terminal of each of the first to fourth sequences of delay circuits 401 to 404 is selected by a corresponding one of four switches, i.e., first to fourth switches 405 to 408. A first clock signal 411 is supplied to the first sequence of delay circuits and a phase comparator 409. A fifth clock signal 415 which passed the first to fourth sequences of delay circuits 401 to 404 is also supplied to the phase comparator 409. The phase comparator 409 compares the first clock signal 411 and the fifth clock signal 415 and generates an UP signal 416 or a DOWN signal 417 based on the comparing result. The UP signal 416 or the DOWN signal 417 is supplied to a counter (UP/DOWN counter) 410.

The counter 410 generates a control signal 418 based on the UP signal 416 or DOWN signal 416, and supplies the control signal to the first to fourth switches 405 to 408. As a result, the phase of the fifth clock signal 415 is set to be equal to the phase of the first clock signal 411.

Delay times of the first to fourth sequence of delay circuits 401 to 404 are equally adjusted. As a result, a time difference between adjacent two of the first clock signal 411, a second clock signal 412, a third clock signal 413, and a fourth clock signal 414 is equal to just ¼ of a one time period of the clock signal.

By synthesizing the first to fourth clock signals 411, 412, 413, and 414, a frequency multiplying circuit can be realized to have a frequency larger 4 times than that of the first clock signal.

However, in the above-mentioned conventional circuit, a method is used in which an external clock signal and a clock signal which has passed through the sequences of delay circuits are compared to correct for a phase difference and a delay difference in order to generate a frequency multiplied clock signal.

For this reason, there is a problem in that a long period of time is necessary until the phase difference is eliminated. Also, there is another problem in that a setup time is long so that power consumption increases in association with the long setup time.

SUMMARY OF THE PRESENT INVENTION

The present invention is provided to solve such problems. Therefore, an object of the present invention is to provide a synchronous delay circuit in which a setup time can be shortened and low power consumption can be realized.

Another object of the present invention is to provide a frequency multiplier circuit using a synchronous delay circuit.

In order to achieve an aspect of the present invention, a frequency multiplier circuit includes a first delaying section for delaying a first pulse of a reference signal for a predetermined delay time, the reference signal including the first pulse and a second pulse subsequent to the first pulse, a second delaying section for generating n (n is an integer more than 0) delayed signals from the reference signal, wherein the first delayed signal of the n delayed signals has a predetermined delay time as a first delay time, and a m-th delayed signal (m is an positive integer and $m \leq n$) of the n delayed signals has m times the predetermined delay time as a m-th delay time, and a signal generating section for generating a frequency multiplied signal from the reference signal and the n delayed signals.

The first delaying section may include a sequence of delay circuits for delaying the first pulse of the reference signal, and a detecting circuit for detecting a position of one of the delay circuits corresponding to the predetermined delay time. In this case, the second delaying section generates the n delayed signals from the reference signal using the detected position.

The detecting circuit may include a sequence of data holding circuits, wherein one of the data holding circuits corresponding to the predetermined delay time is set to indicate the detected position.

Also, the second delaying section may include at least one sequence of delay circuits, and generates the n signals by using a delay time by one of the delay circuits of the at least one sequence corresponding to the detected position and ones of the delay circuits subsequent to the one delay circuit. In this case, a number of delay circuits to the detected position of the sequence may be n times of a total number of the one delay circuit and the subsequent delay circuits of the at least one sequence. Alternatively, the number of delay circuits to the detected position of the sequence may be 2n times of a total number of the one delay circuit and the subsequent delay circuits of the at least one sequence.

Further, the second delaying section may generate the n delayed signals by generating a first delayed signal from the reference signal and a m-th delayed signal from a (m-1)-th delayed signal.

The first delaying section may include a first sequence of delay circuits for delaying the first pulse of the reference signal, and a detecting circuit for detecting a position of one of the delay circuits corresponding to the predetermined delay time. In this case, the second delaying section may include a second sequences of delay circuits for delaying the second pulse of the reference signal by the predetermined delay time based on the detected position to generate the first delayed signal having the predetermined delay time as the first delay time with respect to the reference signal, a third sequence of delay circuits for delaying the first delayed signal by the predetermined delay time based on the detected position to generate the second signal having twice of the predetermined delay time as the second delay time with respect to the reference signal, and a fourth sequence of delay circuits for delaying the second delayed signal by the predetermined delay time based on the detected position to generate the third delayed signal having three times of the predetermined delay time as the third delay time with respect to the reference signal, the first to third delay signals and the reference signal being outputted in parallel. In this case, the signal generating section may include a first calculating circuit for calculating an exclusive OR of the reference signal and the first delayed signal to produce a first calculation signal, a second calculating circuit for calculating an exclusive OR of the second delayed signal and the third delayed signal to produce a second calculation signal, and a third calculating circuit for calculating an exclusive OR of the first calculation signal and the second calculation signal to produce the frequency multiplied signal.

Also, the first delaying section may include a first sequence of delay circuits for delaying the first pulse of the reference signal, a detecting circuit for detecting a position of one of the delay circuits corresponding to the predetermined delay time, and a first one-shot oscillator for generating a first one-shot pulse from the second pulse of the reference signal. In this case, the second delaying section may include a selector for selecting, as a selected signal, one of the first one-shot pulse and a second one-shot pulse in accordance with a selector control signal, a second sequence of delay circuits for delaying the selected signal by the predetermined delay time to generate a delayed signal, a counter for counting a number of generations of the delayed signal, and outputting the selector control signal to the selector such that the selector selects the first one-shot pulse when the count value is 0, and such that the selector selects the second one-shot pulse when the count value is not 0, a second one-shot oscillator for generating the second one-shot pulse in response to each of the generations of the delayed signal by the second sequence of delayed circuits, such that the first to third delayed signals are generated in serial to have the first to third delay times, respectively, and a multiplexer for passing the first one-shot pulse and then three second one-shot pulses as the first to third delayed signals to produce a basic signal. In this case, the signal generating section may include a flip-flop circuit for counting the basic signal to produce the frequency multiplied signal.

Further, the first delaying section may include a first sequence of delay circuits including a first input delay circuit and a first output delay circuit, for receiving the first pulse of the reference signal by the first input delay circuit to delay the first pulse and for outputting the delayed first pulse from the first output delay circuit to the first input delay circuit when the delayed first pulse is overflowed, a first counter for counting a number of overflows of the delayed first pulse, a detecting circuit for detecting a position of one of the delay circuits corresponding to the predetermined delay time, and a first one-shot oscillator for generating a first one-shot pulse from the second pulse of the reference signal. In this case, the second delaying section may include a selector for selecting, as a selected signal, one of the first one-shot pulse and a second one-shot pulse in accordance with a selector control signal, a second sequence of delay circuits including a second input delay circuit and a second output delay circuit, for receiving the selected signal by the second input delay circuit to delay the selected signal by the predetermined delay time and for outputting the delayed selected signal from the second output delay circuit to the second input delay circuit when the delayed selected signal is overflowed, such that the selected signal is delayed by the predetermined delay time, a second counter for counting a number of overflows and for allowing the outputting of the delayed selected signal from the second output delay circuit to the second input delay circuit based on the counted number of overflows by the second counter and the counted number of overflows by the first counter, a third counter for counting a number of generations of the delayed signal from the second output delay circuit, and for outputting the selector control signal to the selector such that the selector selects the first one-shot pulse when the count value is 0, and such that the selector selects the second one-shot pulse when the count value is not 0, a second one-shot oscillator for generating the second one-shot pulse in response to each of the generations of the delayed signal by the second sequence of delayed circuits, such that the first to third delayed signals are generated in serial to have the first to third delay times, respectively, and a multiplexer for passing the first one-shot pulse and then three second one-shot pulses as the first and third delayed signals to produce a basic signal. In this case, the signal generating section may include a flip-flop circuit for counting the basic signal to produce the frequency multiplied signal.

In order to achieve another aspect of the present invention, a synchronous delay circuit includes a first delaying section for delaying a first pulse of a reference signal for a predetermined delay time, the reference signal including the first pulse and a second pulse subsequent to the first pulse, and a second delaying section for generating n (n is an integer more than 0) delayed signals from the reference signal, wherein the first delayed signal of the n delayed signals has the predetermined delay time as a first delay time, and a m-th delayed signal (m is an positive integer and m≦n) of the n delayed signals has m times of the predetermined delay time as a m-th delay time.

In order to achieve still another aspect of the present invention, a synchronous delay circuit includes a first sequence of delay circuits for delaying a first pulse of a reference signal by a predetermined delay time, the reference signal including the first pulse and a second pulse subsequent to the first pulse, a detecting circuit for detecting a position of one of the delay circuits corresponding to the predetermined delay time, a second sequences of delay circuits for delaying the second pulse of the reference signal by the predetermined delay time based on the detected position to generate the first delayed signal having the predetermined delay time as the first delay time with respect to the reference signal, a third sequence of delay circuits for delaying the first delayed signal by the predetermined delay time based on the detected position to generate the second signal having twice of the predetermined delay time as the second delay time with respect to the reference signal, and a fourth sequence of delay circuits for delaying the second delayed signal by the predetermined delay time based on the detected position to generate the third delayed signal having three times of the predetermined delay time as the third delay time with respect to the reference signal, the first to third delay signals and the reference signal being outputted in parallel.

In order to achieve yet still another aspect of the present invention, a synchronous delay circuit includes a first sequence of delay circuits for delaying a first pulse of a reference signal by a predetermined delay time, the reference signal including the first pulse and a second pulse subsequent to the first pulse, a detecting circuit for detecting a position of one of the delay circuits corresponding to the predetermined delay time, a first one-shot oscillator for generating a first one-shot pulse from the second pulse of the reference signal, a selector for selecting, as a selected signal, one of the first one-shot pulse and a second one-shot pulse in accordance with a selector control signal, a second sequence of delay circuits for delaying the selected signal by the predetermined delay time to generate a delayed signal, a counter for counting a number of generations of the delayed signal, and for outputting the selector control signal to the selector such that the selector selects the first one-shot pulse when the count value is 0, and such that the selector selects the second one-shot pulse when the count value is not 0, a second one-shot oscillator for generating the second one-shot pulse in response to each of the generations of the delayed signal by the second sequence of delayed circuits, such that the first to third delayed signals are generated in serial to have the first to third delay times, respectively, and a multiplexer for outputting the first one-shot pulse and then the second one-shot pulses each time each of the second one-shot pulses is generated.

In order to achieve another aspect of the present invention, a synchronous delay circuit includes a first sequence of delay circuits including a first input delay circuit and a first output delay circuit, for receiving a first pulse of a reference signal by the first input delay circuit to delay the first pulse and for outputting the delayed first pulse from the first output delay circuit to the first input delay circuit when the delayed first pulse is overflowed, such that the first pulse is delayed by a predetermined delay time, the reference signal including the first pulse and a second pulse subsequent to the first pulse, a first counter for counting a number of overflows of the delayed first pulse, a detecting circuit for detecting a position of one of the delay circuits corresponding to the predetermined delay time, a first one-shot oscillator for generating a first one-shot pulse from the second pulse of the reference signal, a selector for selecting, as a selected signal, one of the first one-shot pulse and a second one-shot pulse in accordance with a selector control signal, a second sequence of delay circuits including a second input delay circuit and a second output delay circuit, for receiving the selected signal by the second input delay circuit to delay the selected signal by the predetermined delay time, and for outputting the delayed selected signal from the second output delay circuit to the second input delay circuit when the delayed selected signal is overflowed, such that the selected signal is delayed by the predetermined delay time, a second counter for counting a number of overflows and for allowing the outputting of the delayed selected signal from the second output delay circuit to the second input delay circuit based on the counted number of overflows by the second counter and the counted number of overflows by the first counter, a third counter for counting a number of generations of the delayed signal from the second output delay circuit, and for outputting the selector control signal to the selector such that the selector selects the first one-shot pulse when the count value is 0, and such that the selector selects the second one-shot pulse when the count value is not 0, a second one-shot oscillator for generating the second one-shot pulse in response to each of the generations of the delayed signal by the second sequence of delayed circuits, such that the first to third delayed signals are generated in serial to have the first to third delay times, respectively, and a multiplexer for outputting the first one-shot pulse and then the second one-shot pulses each time each of the second one-shot pulses is generated.

DESCRIPTION OF THE PREFERRED EMBODIMENTS

A frequency multiplying circuit using a synchronous delay circuit of the present invention will now be described below with reference to the attached drawings.

Figure 2:
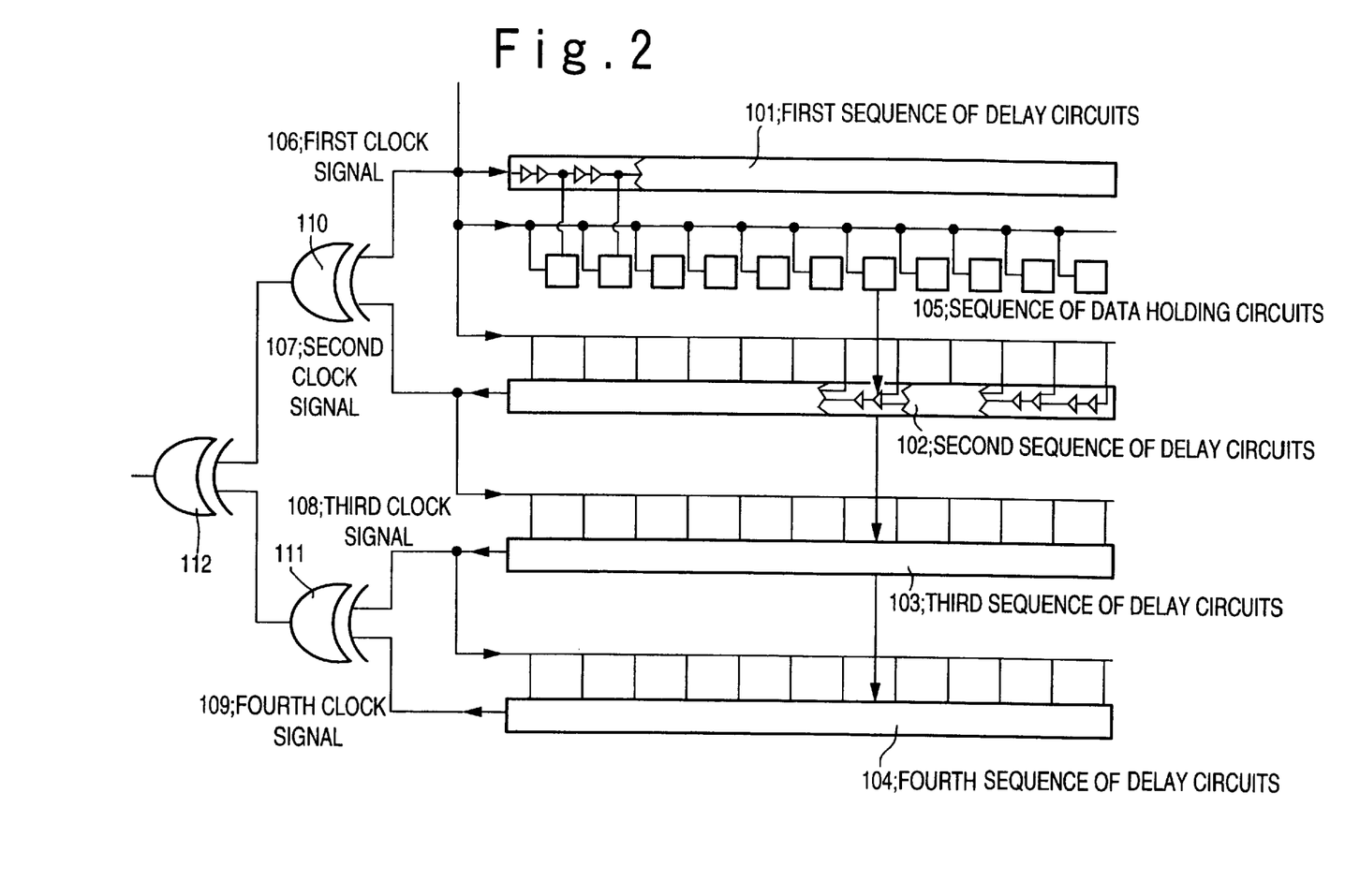
FIG. 2 is a block diagram illustrating the structure of a frequency multiplying circuit using a synchronous delay circuit according to a first embodiment of the present invention.

FIG. 2 is a block diagram illustrating the structure of a synchronous delay circuit of the first embodiment of the present invention. Referring to FIG. 2, the frequency multiplier circuit is composed of a synchronous delay circuit and three exclusive OR gates 110, 111 and 112. The synchronous delay circuit is composed of first to fourth sequences of delay circuits 101 to 104, and a data holding circuit sequence 105.

Each of the delay circuits of the first sequence 101 is composed of, for example, an inverter. The first sequence of delay circuits 101 has an output terminal at every predetermined delay time, for example, for 2 inverters. The second sequence of delay circuits 102 is arranged in a signal propagating direction opposite to that of the first sequence of delay circuits 101 and has an input terminal every predetermined delay time.

The second sequence of delay circuits 102, the third sequence of delay circuits 103, and the fourth sequence of delay circuits 104 are constituted in the same manner as the first sequence of delay circuits 101 and are serially connected. That is, the second sequence of delay circuits 102 receive the input clock signal of the first sequence of delay circuits 101 and outputs a second clock signal 107 having the predetermined delay time with respect to the first clock signal. The third sequence of delay circuits 103 receive the second clock signal outputted from the second sequence of delay circuits 102, and outputs a third clock signal 108 having twice the predetermined delay time with respect to the first clock signal. The fourth sequence of delay circuits 104 receive the third clock signal outputted from the third sequence of delay circuits 103, and outputs a fourth clock signal 109 having three times the predetermined delay time with respect to the first clock signal 106.

Each of the data holding circuits of the data holding circuit sequence 105 is connected to a portion of the delay circuits of the first sequence 101 corresponding to the predetermined delay time. The data holding circuits do not need to be provided for all of the delay circuits of the first sequence 101. The data holding circuits are sufficient to be provided for the portion of the delay circuits of the first sequence 101 corresponding to the predetermined delay time. The reason why a plurality of data holding circuits are provided Is that the delay time of each of the delay circuits of the first sequence 101 possibly varies depending upon the manufacturing process.

One of the input terminals of each data holding circuit is connected to the corresponding delay circuit and the other input terminal is connected to the first clock signal. Each data holding circuit is set when the output of the corresponding delay circuit is a high level and the first clock signal is also a high level. This state is reset immediately before the data holding circuit is set again.

Although all of the connections of the data holding circuits are not shown in FIG. 2, the output of each of the data holding circuits is connected to a corresponding one of the delay circuits of the second sequence 102, a corresponding one of the delay circuits of the third sequence 103, and a corresponding one of the delay circuits of the fourth sequence 104, respectively. Thus, each data holding circuit selects one delay circuit from among a plurality of delay circuits of each sequence.

The operation of the synchronous delay circuit in the first embodiment will now be described.

The first clock signal 106 having a time period of t includes two continuous pulses, i.e., a first pulse and a second pulse. The first pulse of the first clock signal is supplied to the first sequence of delay circuits 101, and progresses through the first sequence of delay circuits 101. The output of each of the delay circuits of the first sequence 101 changes in level from a low level to a high level and from the high level to the low level during the progress of the first pulse. The output of each delay circuit is supplied to the corresponding data holding circuit of the sequence 105.

When the first pulse is moving through the first sequence of delay circuits 101 as mentioned above, the second pulse of the first clock signal is supplied to the sequence of data holding circuits 105 and the second sequence of delay circuits 102. In this example, one of the input terminals of a specific one of the data holding circuits is connected to the corresponding one of the delay circuits of the first sequence 101 set to the high level. At the same time, the other input terminal thereof is set to the high level because of the second pulse. Thus, the specific data holding circuit is set to output the high level. As a result, the specific data holding circuit sets a specific one of the delay circuits of the second sequence 102 corresponding to the specific data holding circuit.

Also, the specific data holding circuit sets a specific one of the delay circuits of the third sequence 103 corresponding to the specific data holding circuit, and a specific one of the delay circuits of the fourth sequence 104 corresponding to the specific data holding circuit. As a result, the specific delay circuit of each of the second to fourth sequence 102, 103 and 104 are set to the active state, as shown in FIG. 2 by an arrow. In this manner, the sequence of data holding circuits 105 functions to detect a position corresponding to the predetermined delay time.

As an example, the specific delay circuit of the second sequence of delay circuits 102 corresponding to the position of the specific data holding circuit inputs not a signal from the previous stage of the second sequence of delay circuits 102 but the first clock signal 106. Then, the specific delay circuit of the second sequence 102 sends the output signal to the next stage of delay circuit in the left direction in FIG. 2.

In this manner, the second pulse is passed through the second sequence of delay circuits 102 with the predetermined delay time, ¼ of the time period of the first clock signal. The ¼ of the time period is determined based on the number of sequences of delay circuits. Then, the delayed second pulse is passed through the third sequence of delay circuits 103, and the fourth sequence of delay circuits 104. That is, the delay time of ¼ of the time period of the first clock signal is applied to the delayed second pulse supplied from the second sequence of delay circuits 102 in each of the third and fourth sequence of delay circuits 103 and 104.

That is, the second pulse travels through the second sequence of delay circuits 102 while being delayed by the predetermined delay time and is outputted as the second clock signal pulse 107. The third sequence of delay circuits 103 receives the second clock signal 107 outputted from the second sequence of delay circuits 102 in the specific delay circuit of the third sequence 103 corresponding to the position (stage) of the specific data holding circuit which outputs the high level.

The received second clock signal travels through the third sequence of delay circuits 103 while being delayed by the predetermined delay time and is outputted as the third clock signal 108. The fourth sequence of delay circuits 104 receives the third clock signal 108 outputted from the third sequence of delay circuits 103 in the specific delay circuit corresponding to the position (stage) of the specific data holding circuit which outputs the high level. The received third clock signal travels through the fourth sequence of delay circuits 104 while being delayed by the predetermined delay time and is outputted as the fourth clock signal 109.

In the first embodiment, a delay time in each of the second sequence of delay circuits 102, the third sequence of delay circuits 103, and the fourth sequence of delay circuits 104 is set to ¼ of the time period of the first clock signal, as described above. As a result, the second clock signal 107 is outputted from the second sequence of delay circuits 102 with the delay time of ¼t with respect to the first clock signal 106.

Also, the third clock signal 108 is outputted from the third sequence of delay circuits 103 with the delay time of ¼t with respect to the second clock signal 107. Further, the fourth clock signal 109 is outputted from the fourth sequence of delay circuits 104 with the delay time of ¼t with respect to the third clock signal 108.

The first and second clock signals 106 and 107 are supplied to the exclusive OR circuit 110. The third and fourth clock signals 108 and 109 are supplied to the exclusive OR circuit 111. The output of the exclusive OR circuit 110 and the output of the exclusive OR circuit 111 are supplied to the exclusive OR circuit 112 to produce a clock signal having a frequency of 4 times of that of the first clock signal.

According to the first embodiment, the delay time in each of the second to fourth sequence of delay circuit is set to ¼ of time period of the first clock signal. This is accomplished by constituting the first sequence of the delay circuits 101 to have the delay time equal to the time period of the first clock signal and by constituting the second to fourth sequences of the delay circuits 102, 103 and 104 to have the delay time of ¼ of the time period of the first clock signal by reducing the number of delay circuits.

Figure 3:
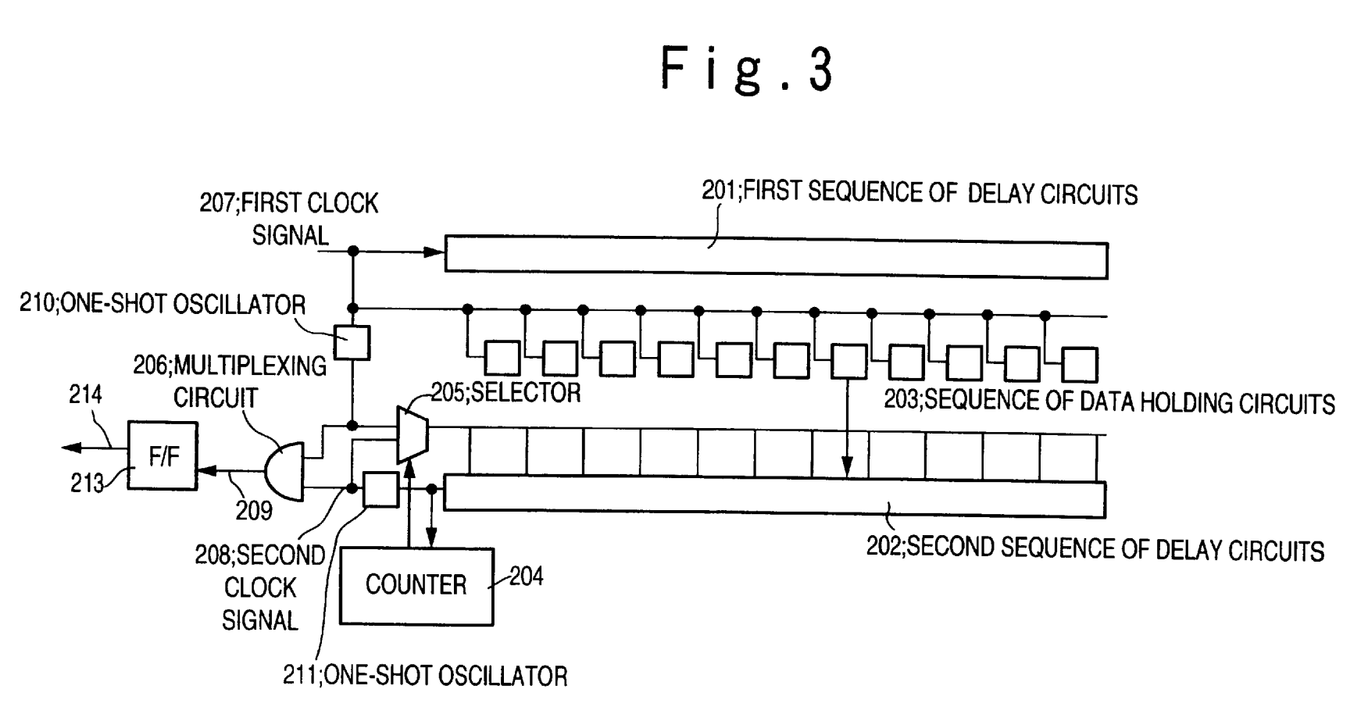
FIG. 3 is a block diagram illustrating the structure of a frequency multiplying circuit using a synchronous delay circuit according to a second embodiment of the present invention.

Next, the frequency multiplying circuit using the synchronous delay circuit according to the second embodiment of the present invention will now be described. FIG. 3 is a block diagram illustrating the structure of the frequency multiplying circuit using the synchronous delay circuit according to the second embodiment of the present invention.

Referring to FIG. 3, the frequency multiplying circuit using the synchronous delay circuit in the second embodiment is composed of a first sequence of delay circuits 201, a second sequence of delay circuits 202, a sequence of data holding circuits 203, a counter 204, a switch (selector) 205, a multiplexer 206, one-shot oscillators 210 and 211, and a flip-flop 213. The first and second sequences of delay circuits 201 and 202 and the sequence of data holding circuits 203 have the same structure and operation as those of the first and second sequences of delay circuits 101 and 102 and the sequence of data holding circuits 105 in the first embodiment.

The one-shot oscillator 210 receives each of pulses of the first clock signal 207 to generate one pulse having a high level dwelling time shorter than ¼ of the time period of the first clock signal 207. This is because a frequency multiplying signal having a frequency of 4 times of the first clock signal 207 should be generated in this embodiment. The output of the one-shot oscillator 210 is supplied to the multiplexer 206 and the switch 205.

An output of the second sequence of delay circuits 202 is connected to the one-shot oscillator 211 and the counter 204.

The one-shot oscillator 211 receives a pulse outputted from the second sequence of delay circuits 202 to generate one pulse having a high level dwelling time shorter than ¼ of the time period of the first clock signal 207 in the same manner as the one-shot oscillator 210. The output of the one-shot oscillator 211 is supplied to the multiplexer 206 and the switch 205.

The counter 204 counts the number of times of the output from the second sequence of delay circuits 202 to generate a control signal. The switch 205 selects the output pulse supplied from the one-shot oscillator 210 in response to the control signal generated from the counter 204 when the count is 0. On the contrary, the switch 205 selects the output pulse supplied from the one-shot oscillator 211 in response to the control signal generated from the counter 204 when the count is not 0. The signal pulse selected by the switch 205 is supplied to the second sequence of delay circuits 202 to form a loop.

The multiplexer 206 outputs the output pulse supplied from the one-shot oscillator 210 for the first time and then the output pulse supplied from the one-shot oscillator 211. Thus, a clock signal can be generated to have a frequency of 4 times of that of the first clock signal. The flip-flop 213 frequency-divides the output signal supplied from the multiplexer 206 to generate a clock signal having a frequency of twice of the first clock signal and having a duty ratio of 50%.

The operation of the embodiment will now be described. The output of a specific one the data holding circuits of the sequence 203 corresponding to a delay time of the time period of the first clock signal is set to the H level in response to the first pulse and the second pulse of the first clock signal 207 having the time period of t. As a result, a specific one of the delay circuits of delay circuits 202 corresponding to the specific data holding circuit is set to the operable state, as in the first embodiment.

After that, a first one-shot pulse is generated by the one-shot oscillator 210 in response to the first pulse of the first clock signal 207 and supplied to the second sequence of delay circuits 202 through the switch 205. The first one-shot pulse is supplied to the multiplexer 206 and then outputted therefrom to the flip-flop circuit 213 as the third clock signal 209. Also, the first one-shot pulse is circulated in the loop composed of the second sequence of delay circuits 202, the one-shot oscillator 211, and the switch 205.

The number of times of circulation is counted by the counter 204. Therefore, the second one-shot pulse which is generated as the second clock signal 208 by the one-shot oscillator 211 in response to the output from the second sequence of delay circuits 202 is circulated until the count of the counter 204 is equal to 3. That is, the second clock signal 208 is generated for every predetermined delay time and supplied to the switch 205. Also, the second clock signal 208 is supplied to the multiplexer 206 and outputted therefrom as the third clock signal 209.

The flip-flop circuit 213 decodes the third clock signal into a clock signal having a frequency of twice of that of the first clock signal having the duty ratio of 50%.

If the duty ratio of 50% is not necessary, the third clock signal has a frequency of 4 times of that of the first clock signal. Therefore, in order to generate the third clock signal, the flip-flop circuit 213 can be omitted.

Also, if the delay time by the second sequence of delay times is ⅛ of the time period of the first clock signal and the counter counts 7, a clock signal having a frequency of 4 times of that of the first clock signal and having the duty ratio of 50% can be outputted from the flip-flop circuit 213.

That is, in the second embodiment, a delay time of the second sequence of delay circuits 202 is set to ¼ of that of the first sequence of delay circuits 201 and the set value of the counter 204 is set to 3. Consequently, a time period of the third clock signal 209 is equal to ¼ of the time period of the first clock signal 207.

In the second embodiment, the number of sequences of delay circuits can be reduced by using the counter 204, as compared with the circuit structure of the first embodiment.

Figure 4:
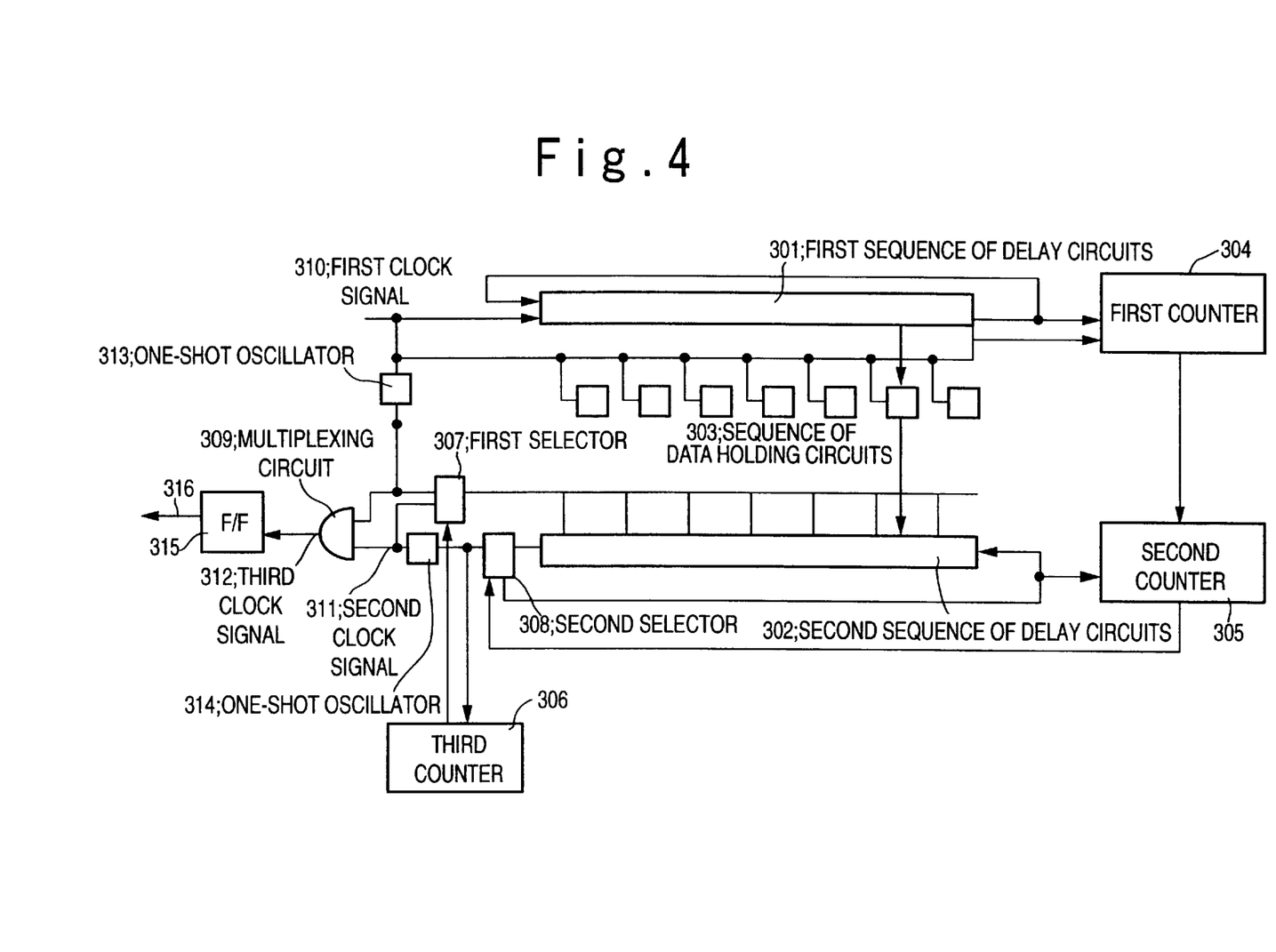
FIG. 4 Is a block diagram illustrating the structure of a frequency multiplying circuit using a synchronous delay circuit according to a third embodiment of the present invention.

The frequency multiplying circuit using the synchronous delay circuit according to the third embodiment of the present invention will now be described. FIG. 4 is a block diagram illustrating the structure of the frequency multiplying circuit using the synchronous delay circuit according to the third embodiment of the present invention.

Referring to FIG. 4, the frequency multiplying circuit is composed of a synchronous delay circuit and a flip-flop circuit 315. The synchronous delay circuit is composed of a first sequence of delay circuits 301, a second sequence of delay circuits 302, a sequence of data holding circuits 303, a first counter 304, a second counter 305, a third counter 306, a first switch 307, a second switch 308, one-shot oscillators 313 and 314, and a multiplexing circuit 309.

The circuit section composed of the one-shot oscillator 313, the first switch 307, the one-shot oscillator 314, the third counter 306 and the multiplexer 309 operates in the same manner as the circuit section composed of the one-shot oscillator 210, the switch 205, the one-shot oscillator 211, the counter 204 and the multiplexer 206 in the second embodiment. Therefore, the description of the structure and operation is omitted.

The structure and operation of the sequence of data holding circuits 303 is basically similar to those of the sequence of data holding circuits 203 in the second embodiment. Therefore, the description of the structure and operation is omitted.

An output of the last delay circuit of the first sequence of delay circuits 301 is connected to the first delay circuit of the first sequence of delay circuits 301 and the first counter 304. Therefore, a first clock signal 310 and the first sequence of delay circuits 301 are supplied to the first delay circuit of the first sequence of delay circuits 301. The first counter 304 counts the number of times of output from the delayed first clock signal.

An output of the second sequence of delay circuits 302 is supplied to an input terminal of the second switch 308. An output of the second switch 308 is supplied to the one-shot oscillator 314, a first of the delay circuits of the second sequence 302, and the second counter 305. The first counter 304 outputs the count value to the second counter 305. The second counter 305 counts the number of times of output from the second sequence of delay circuits 302. When the count value by the second counter 305 is smaller than the count value supplied from the first counter 304, the second counter 305 outputs a control signal to the second switch 308 such that the second switch 308 supplies the output from the last one of the delay circuits of the second sequence 302 to the first one of the delay circuits of the second sequence 302 without outputting it to the third counter 306 and the one-shot oscillator 314.

The operation of the frequency multiplying circuit using the synchronous delay circuit according to the third embodiment will now be described.

In the procedure such that the first pulse and the next pulse of the first clock signal 310 having the time period of t supplied to the first sequence of delay circuits 301, the sequence of data holding circuits 303 and the one-shot oscillator 313. Thus, a specific one of the data holding circuits of the sequence 303 is set to the high level, as in the first and second embodiments. As a result, a specific one of the delay circuits of the second sequence 302 is set to an operable state. The delay time by the first sequence of delay circuits 301 is smaller than the time period of t of the first clock signal. Therefore, the first clock signal 310 is circulated at least once in the loop of the first sequence of delay circuits 301. The first counter 304 counts the number of times of circulation of the first clock signal 310. When the second pulse of the first clock signal 310 is supplied, the specific data holding circuit of the sequence 303 is set to the high level.

The one-shot pulse is generated in response to the second pulse of the first clock signal 310 and supplied to the second sequence of delay circuits 302 via the first switch 307 and the multiplexer 309. The multiplexer 309 outputs the one-shot pulse from the one-shot oscillator 313 to the flip-flop circuit 315.

Also, the one-shot pulse from the oscillator 313 is received by the specific delay circuit of the second sequence 302 and is circulated in the loop composed of the second switch 308 and the second sequence of delay circuits 302. In this case, the second counter 305 outputs the control signal to the second switch 308 such that the one-shot pulse from the oscillator 313 is circulated the same number of times as the count value from the first counter 304.

Thereafter, the second counter 305 outputs the control signal to the second switch 308 such that the second switch 308 supplied the output from the second sequence of delay circuits 302 to the one-shot oscillator 314 without outputting to the second sequence of delay circuits 302. Thus, a third clock signal 312 is outputted from the multiplexer 309 and a clock signal 316 is outputted from the flip-flop 315, as in the second embodiment. This operation is the same as that of the second embodiment. Therefore, the description is omitted.

In the third embodiment, a delay time of the second sequence of delay circuits 302 is set to ¼ of the unit delay time of the first sequence of delay circuits 301. Since the set value of the third counter 306 is set to 3, the third clock signal 312 is set to a period (¼)t as compared with the period (t) of the first clock signal 310 and becomes a clock signal of 4-times multiplication. Also, the clock signal 316 has a frequency of twice of the first clock signal 310 and the duty ratio of 50%.

In the third embodiment, as compared with the first and second embodiments, the number of sequences of delay circuits and the size of the sequence of delay circuits can be reduced by using a plurality of counters.

As described above, according to the present invention, the clock signal period is measured based on a travel amount of the clock signal pulse progressing in the sequence of delay circuits. One or plural sequences of delay circuits are used. The number of sequences of delay circuits is determined based on the multiplication of frequency of a clock signal to be generated. Instead, the number of times of circulation of the delayed signal is determined based on the multiplication of frequency of the clock signal to be generated.

Further, the delay time of each of the sequences of delay circuits is determined based on the multiplication of frequency of the clock signal to be generated. As a result, a frequency multiplying circuit can generate the frequency multiplied signal with two pulses, i.e., two time periods of the first clock signal. Consequently, there are effects such that a set-up time can be reduced and a low electric power consumption in association with the reduction of the set-up time can be realized.

In addition, if the clock signal is circulated plural times, the sequence of delay circuits can be shortened in length.

What is claimed is:

1. A frequency multiplier circuit comprising:
    a first delaying section for delaying a reference signal and generating an output signal when the reference signal has been delayed by a predetermined delay time;
    a second delaying section for generating n (n is an integer more than 0) delayed signals from said reference signal, wherein a first delayed signal of said n delayed signals has a first delay time with respect to the reference signal, and an m-th delayed signal (m is a positive integer and m≦n) of said n delayed signals has an m-th delay time with respect to the reference signal, wherein the second delaying section has a plurality of different input locations for receiving the reference signal and one of the input locations is set to receive the reference signal in accordance with said output signal from the first delaying section; and
    a signal generating section for generating a frequency multiplied signal from said reference signal and said n delayed signals.

2. A frequency multiplier circuit according to claim 1, wherein said first delaying section includes:
    a sequence of delay circuits for delaying said reference signal; and
    a detecting circuit for detecting a position of one of said delay circuits at whose output a delay time equal to the predetermined delay time has been generated, and for generating said output signal.

3. A frequency multiplier circuit according to claim 2, wherein said detecting circuit includes a sequence of data holding circuits, wherein one of said data holding circuits is set to generate said output signal.

4. A frequency multiplier circuit according to claim 2, wherein said second delaying section includes at least one sequence of delay circuits, one of which is an input delay circuit corresponding to the input location that has been set to receive the reference signal, and generates said first delayed signal by using said input delay circuit and said delay circuits downstream of said input delay circuit.

5. A frequency multiplier circuit according to claim 4, wherein a number of delay circuits in said first delaying section up to the delay circuit, at whose output the delay time is equal to the predetermined delay time, is (n+1) times a total number of said input delay circuit and said downstream delay circuits of said at least one sequence of said second delaying section.

6. A frequency multiplier circuit according to claim 4, wherein a number of delay circuits in said first delaying section up to the delay circuit, at whose output the delay time is equal to the predetermined delay time, is 2(n+1) times a total number of said input delay circuit and said downstream delay circuits of said at least one sequence of said second delaying section.

7. A frequency multiplier circuit according to claim 1, wherein said second delaying section generates said n delayed signals by generating a first delayed signal from said reference signal and an m-th delayed signal from an (m-1)-th delayed signal.

8. A frequency multiplier circuit according to claim 1, wherein said first delaying section includes:
   a first sequence of delay circuits for delaying said reference signal; and
   a detecting circuit for detecting a position of one of said delay circuits at whose output a delay time equal to the predetermined delay time has been generated, and for generating said output signal, and
   wherein n is 3, and
   wherein said second delaying section includes:
      a second sequence of delay circuits for delaying said reference signal by said first delay time;
      a third sequence of delay circuits for delaying said first delayed signal by said first delay time to generate a second delayed signal having a delay time that is twice that of said first delayed signal with respect to said reference signal; and
      a fourth sequence of delay circuits for delaying said second delayed signal by said first delay time to generate a third delayed signal having a delay time that is three times that of said first delayed signal with respect to said reference signal, said first to third delay signals and said reference signal being outputted in parallel.

9. A frequency multiplier circuit according to claim 8, wherein said signal generating section includes:
   a first calculating circuit for calculating an exclusive OR of said reference signal and said first delayed signal to produce a first calculation signal;
   a second calculating circuit for calculating an exclusive OR of said second delayed signal and said third delayed signal to produce a second calculation signal; and
   a third calculating circuit for calculating an exclusive OR of said first calculation signal and said second calculation signal to produce said frequency multiplied signal.

10. A frequency multiplier circuit according to claim 1, wherein said first delaying section includes:
    a first sequence of delay circuits for delaying said reference signal;
    a detecting circuit for detecting a position of one of said delay circuits at whose output a delay time equal to the predetermined delay time has been generated; and
    a first one-shot oscillator for generating a first one-shot pulse from said reference signal, and
    wherein n is 3, and
    wherein said second delaying section includes:
       a selector for selecting one of said first one-shot pulse and a second one-shot pulse in accordance with a selector control signal;
       a second sequence of delay circuits for delaying said selected signal by said first delay time to generate a delayed signal;
       a counter for counting a number of generations of said delayed signal, and outputting said selector control signal to said selector such that said selector selects said first one-shot pulse when a count value is 0, and such that said selector selects said second one-shot pulse when the count value is not 0; and
       a second one-shot oscillator for generating said second one-shot pulse in response to each of the generations of said delayed signal by said second sequence of delayed circuits, such that said first to third delayed signals are generated in series to have said first to third delay times, respectively.

11. A frequency multiplier circuit according to claim 10, wherein said signal generating section includes:
    a multiplexer for passing said first one-shot pulse and then three second one-shot pulses as said first to third delayed signals to produce a basic signal.

12. A frequency multiplier circuit according to claim 11, wherein said signal generating section further includes:
    a flip-flop circuit for counting said basic signal to produce said frequency multiplied signal.

13. A frequency multiplier circuit according to claim 1, wherein said first delaying section includes:
    a first sequence of delay circuits including a first input delay circuit and a first output delay circuit, for initially receiving said reference signal at said first input delay circuit and for subsequently receiving a delayed signal at said first input delay circuit from said first output delay circuit when the delayed signal has not been delayed by the predetermined delay time;
    a first counter for counting a number of times the delayed signal is supplied to the first input delay circuit from the first output delay circuit;
    a detecting circuit for detecting a position of one of said delay circuits at whose output a delay time equal to the predetermined delay time has been generated; and
    a first one-shot oscillator for generating a first one-shot pulse from said reference signal, and
    wherein n is 3, and
    wherein said second delaying section includes:
       a selector for selecting one of said first one-shot pulse and a second one-shot pulse in accordance with a selector control signal;
       a second sequence of delay circuits including a second input delay circuit and a second output delay circuit, for initially receiving said selected signal at said second input delay circuit and for subsequently receiving a delayed signal at said second input delay circuit from said second output delay circuit when the delayed signal has not been delayed by the first delay time;
       a second counter for counting a number of times the delayed signal is supplied to the second input delay circuit from the second output delay circuit and for allowing the outputting of the delayed signal from said second output delay circuit to said second input delay circuit based on the number counted by said first counter;
       a third counter for counting a number of generations of said delayed signal from said second output delay circuit, and for outputting said selector control signal to said selector such that said selector selects said first one-shot pulse when a count value is 0, and such that said selector selects said second one-shot pulse when the count value is not 0; and
       a second one-shot oscillator for generating said second one-shot pulse in response to each of the generations of said delayed signal by said second sequence of delayed circuits, such that said first to third delayed signals are generated in series to have said first to third delay times, respectively.

14. A frequency multiplier circuit according to claim 13, wherein said signal generating section includes:
    a multiplexer for passing said first one-shot pulse and then three second one-shot pulses as said first to third delayed signals to produce a basic signal.

15. A frequency multiplier circuit according to claim 14, wherein said signal generating section further includes:
   a flip-flop circuit for counting said basic signal to produce said frequency multiplied signal.

16. A synchronous delay circuit comprising:
   a first delaying section for delaying a reference signal and generating an output signal when the reference signal has been delayed by a predetermined delay time; and
   a second delaying section for generating n (n is an integer more than 0) delayed signals from said reference signal, wherein a first delayed signal of said n delayed signals has a first delay time with respect to the reference signal, and an m-th delayed signal (m is a positive integer and m$\leq$n) of said n delayed signals has an m-th delay time with respect to the reference signal, wherein the second delaying section has a plurality of different input locations for receiving the reference signal and one of the input locations is set to receive the reference signal in accordance with said output signal from the first delaying section.

17. A synchronous delay circuit according to claim 16, wherein said first delaying section includes:
   a sequence of delay circuits for delaying said reference signal; and
   a detecting circuit for detecting a position of one of said delay circuits at whose output a delay time equal to the predetermined delay time has been generated, and for generating said output signal.

18. A synchronous delay circuit according to claim 17, wherein said detecting circuit includes a sequence of data holding circuits, wherein one of said data holding circuits is set to generate said output signal.

19. A synchronous delay circuit according to claim 17, wherein said second delaying section includes at least one sequence of delay circuits, one of which is an input delay circuit corresponding to the input location that has been set to receive the reference signal, and generates said first delayed signal by using said input delay circuit and said delay circuits downstream of said input delay circuit.

20. A synchronous delay circuit according to claim 19, wherein a number of delay circuits in said first delaying section up to the delay circuit, at whose output the delay time is equal to the predetermined delay time, is (n+1) times a total number of said input delay circuit and said downstream delay circuits of said at least one sequence of said second delaying section.

21. A frequency multiplier circuit according to claim 19, wherein a number of delay circuits in said first delaying section up to the delay circuit, at whose output the delay time is equal to the predetermined delay time, is 2(n+1) times a total number of said input delay circuit and said downstream delay circuits of said at least one sequence of said second delaying section.

22. A synchronous delay circuit comprising:
   a first sequence of delay circuits for delaying a reference signal;
   a detecting circuit for detecting a position of one of said delay circuits at whose output a delay time equal to the predetermined delay time has been generated, and for generating an output signal thereat;
   a second sequence of delay circuits for delaying said reference signal by a first delay time based on said output signal to generate a first delayed signal;
   a third sequence of delay circuits for delaying said first delayed signal by said first delay time based on said output signal to generate a second delayed signal having a delay time that is twice that of said first delayed signal with respect to said reference signal; and
   a fourth sequence of delay circuits for delaying said second delayed signal by said first delay time based on said output signal to generate a third delayed signal having a delay time that is three times that of said first delayed signal with respect to said reference signal, said first to third delay signals and said reference signal being outputted in parallel.

23. A synchronous delay circuit comprising:
   a first sequence of delay circuits for delaying a reference signal;
   a detecting circuit for detecting a position of one of said delay circuits at whose output a delay time equal to the predetermined delay time has been generated, and for generating an output signal thereat;
   a first one-shot oscillator for generating a first one-shot pulse from said reference signal;
   a selector for selecting one of said first one-shot pulse and a second one-shot pulse in accordance with a selector control signal;
   a second sequence of delay circuits for delaying said selected signal by said first delay time to generate a delayed signal based on said output signal;
   a counter for counting a number of generations of said delayed signal, and outputting said selector control signal to said selector such that said selector selects said first one-shot pulse when a count value is 0, and such that said selector selects said second one-shot pulse when the count value is not 0;
   a second one-shot oscillator for generating said second one-shot pulse in response to each of the generations of said delayed signal by said second sequence of delayed circuits, such that said first to third delayed signals are generated in series to have said first to third delay times, respectively; and
   a multiplexer for outputting said first one-shot pulse and then said second one-shot pulses each time each of said second one-shot pulses is generated.

24. A synchronous delay circuit comprising:
   a first sequence of delay circuits including a first input delay circuit and a first output delay circuit, for initially receiving a reference signal at said first input delay circuit and for subsequently receiving a delayed signal at said first input delay circuit from said first output delay circuit;
   a first counter for counting a number of times the delayed signal is supplied to the first input delay circuit from the first output delay circuit;
   a detecting circuit for detecting a position of one of said delay circuits at whose output a delay time equal to a predetermined delay time has been generated and for generating an output signal thereat;
   a first one-shot oscillator for generating a first one-shot pulse from said reference signal;
   a selector for selecting one of said first one-shot pulse and a second one-shot pulse in accordance with a selector control signal;
   a second sequence of delay circuits including a second input delay circuit and a second output delay circuit, for initially receiving said selected signal at a delay circuit indicated by said output signal and for subsequently receiving a delayed signal at said second input delay circuit;

a second counter for counting a number of times the delayed signal is supplied to the second input delay circuit from the second output delay circuit and for allowing the outputting of the delayed signal from said second output delay circuit to said second input delay circuit based on the number counted by said first counter;

a third counter for counting a number of generations of said delayed signal from said second sequence of delay circuits, and for outputting said selector control signal to said selector such that said selector selects said first one-shot pulse when a count value is 0, and such that said selector selects said second one-shot pulse when the count value is not 0;

a second one-shot oscillator for generating said second one-shot pulse in response to each of the generations of said delayed signal by said second sequence of delay circuits, such that said first to third delayed signals are generated in series to have said first to third delay times, respectively; and a multiplexer for outputting said first one-shot pulse and then said second one-shot pulses each time each of said second one-shot pulses is generated.

25. A frequency multiplier circuit according to claim 1, wherein the predetermined delay time is (n+1) times the first delay time.

26. A frequency multiplier circuit according to claim 1, wherein the first through m-th delay times are integer multiples of the first delay time.

27. A frequency multiplier circuit according to claim 26, wherein the first through m-th delay times vary as the input location for receiving the reference signal varies.

28. A frequency multiplier circuit according to claim 1, wherein n=3 and the second delaying section includes first, second, and third sequences of delay circuits for generating first, second, and third delayed signals, respectively, and wherein the first, second, and third delayed signals are generated from the reference signal, the first delayed signal, and the second delayed signal, respectively.

29. A frequency multiplier circuit according to claim 28, wherein locations for inputting the reference signal, the first delayed signal, and the second delayed signal to the first, second, and third sequences of delay circuits, respectively, vary in accordance with the output signal from the first delaying section.

30. A synchronous delay circuit according to claim 16, wherein the predetermined delay time is (n+1) times the first delay time.

31. A synchronous delay circuit according to claim 30, wherein the first through m-th delay times vary as the input location for receiving the reference signal varies.

32. A synchronous delay circuit according to claim 16, wherein n=3 and the second delaying section includes first, second, and third sequences of delay circuits for generating first, second, and third delayed signals, respectively, and wherein the first, second, and third delayed signals are generated from the reference signal, the first delayed signal, and the second delayed signal, respectively.

33. A synchronous delay circuit according to claim 32, wherein locations for inputting the reference signal, the first delayed signal, and the second delayed signal to the first, second, and third sequences of delay circuits, respectively, vary in accordance with the output signal from the first delaying section.

34. A synchronous delay circuit comprising:

a first delaying section including a sequence of first delay circuits for delaying a reference signal and generating a setting signal when the reference signal has been delayed by a predetermined delay time; and a second delaying section including at least one sequence of second delay circuits for generating at least one delayed signal from the reference signal, wherein said at least one sequence of second delay circuits receive an input clock signal and generate an output clock signal, and include a plurality of serially connected second delay circuits, wherein the setting signal is supplied to one of the second delay circuits of said at least one sequence to cause that second delay circuit to receive the input clock signal in place of a signal supplied from a second delay circuit connected thereto, and wherein the reference signal is supplied as the input clock signal to a first one of said at least one sequence of second delay circuits and said at least one delayed signal includes the output clock signal generated by each of said at least one sequence of second delay circuits.

35. A synchronous delay circuit according to claim 34, wherein the first delaying section further includes a plurality of data holding circuits, each having a first input connected to receive the reference signal and a second input connected to receive a delayed signal from one of the first delay circuits and generating the setting signal when both the first and the second inputs are at a high level.

36. A synchronous delay circuit according to claim 35, wherein the second delaying section includes three sequences of second delay circuits, and wherein the input clock signal of the first sequence of second delay circuits comprises the reference signal and the input clock signals of the second and third sequences of second delay circuits comprise the output clock signals of the first and second sequences of second delay circuits, respectively.

* * * * *